United States Patent [19]

Fukushima et al.

[11] 4,122,394
[45] Oct. 24, 1978

[54] PHASE-SHIFTING MULTIPLICATION TYPE FM SIGNAL DEMODULATION CIRCUIT

[75] Inventors: Isao Fukushima, Fujisawa; Yoshimi Iso; Isao Akitake, both of Toyokawa, all of Japan

[73] Assignee: Hitachi, Ltd., Japan

[21] Appl. No.: 759,444

[22] Filed: Jan. 14, 1977

[30] Foreign Application Priority Data

Jan. 19, 1976 [JP] Japan ................................. 51-4107
May 21, 1976 [JP] Japan ................................. 51-57777

[51] Int. Cl.² ........................................... H04B 1/16
[52] U.S. Cl. .................................. 325/344; 325/487; 329/103; 329/110
[58] Field of Search ............... 325/317, 318, 344, 346, 325/347, 349, 351, 423, 487; 329/101, 103, 110, 111, 112, 132, 135–137

[56] References Cited

U.S. PATENT DOCUMENTS

| | | | |
|---|---|---|---|
| 3,311,838 | 3/1967 | Danker | 329/111 |
| 3,701,030 | 10/1972 | Gocho et al. | 329/137 X |
| 3,866,125 | 2/1975 | Kilian | 329/137 X |
| 3,999,138 | 12/1976 | Peil et al. | 329/101 X |

Primary Examiner—John C. Martin
Assistant Examiner—Jin F. Ng
Attorney, Agent, or Firm—Craig & Antonelli

[57] ABSTRACT

A phase-shifting multiplication type FM demodulation circuits comprises a gate circuit including a first and a second switching circuit adapted to be switched for an FM intermediate frequency signal, a resonance circuit and a phase-shifting element. The FM intermediate frequency signal is phase-shifted for about $\pi/2$ (or 90°) and the phase-shifted signal (frequency) is fed to the second switching circuit of the gate circuit after the phase-conversion of the phase-shifted FM signal by means of a phase-shifter device. The demodulation circuit further includes a bias resistor for the second switching circuit which resistor serves also as a resonance resistor of the resonance circuit, a substraction circuit for detecting output signal from the gate circuit, an output resistor for determining magnitude of the output signal from the subtraction circuit, and a lowpass filter for eliminating higher harmonics from the output signal appearing across the output resistor thereby producing a demodulated output.

17 Claims, 7 Drawing Figures

PHASE-SHIFTING MULTIPLICATION TYPE FM SIGNAL DEMODULATION CIRCUIT

BACKGROUND OF THE INVENTION

Field of the Invention

The present invention relates to a phase-shifting multiplication type FM signal demodulation circuit.

FIG. 1 is a circuit diagram showing a demodulation circuit of the above type. In the figure, reference numeral 1 denotes an input terminal for FM signal $S_1$, 2 a local oscillation circuit, 3 a frequency mixer which functions to mix the FM signal $S_1$ from the input terminal 1 with a signal $S_3$ output from the local oscillator 2 thereby to produce an FM intermediate frequency signal $S_2$ (10.7 MHz), and numeral 4 designates an amplifier for amplifying the intermediate frequency signal from the frequency mixer or converter 3. The amplifier 4 may be composed of a direct-coupling type differential amplifier having the function of limiting the amplitude of the intermediate frequency signal. The phase-shifting multiplication type demodulation circuit for demodulating the signal from the amplifier 4 is denoted generally by reference numeral 5 and includes a first differential switching circuit 120 A composed of paired transistors 121 and 122 and adapted to be switched by the FM intermediate signal $S_2$ from the amplifier 4, a phase shifting element 220 designed to shift the phase of the FM intermediate signal, a phase-shifter apparatus 200 comprising a resonance circuit 210 for converting the phase or frequency of the FM intermediate signal $S_2'$ which has been phase-shifted by the phase shifting element 220, a second differential switching circuit 120B composed of paired transistors 123 and 124 and adapted to be switched by the phase-converted signal available from the phase-shifter circuit or device 200, a detector circuit 170 for detecting the signal appearing at the output stage of the second switching circuit, and an output resistance 300' for determining the magnitude of the demodulated output from the demodulation circuit. The major portion 100 of the FM demodulation circuit 5 as represented by broken lines is implemented in a form of an integrated circuit configuration. The resonance circuit 210 has a resonance resistor 213 which is provided as an externally accessible element so that the distortion of the demodulated output may be reduced. Numeral 6 denotes a low-pass filter and 7 a tuning indicator.

In the demodulation circuit shown in FIG. 1, the first switching circuit 120A is driven by the FM intermediate frequency signal $S_2$ supplied to the input terminal 100 $a$ of the demodulation circuit, while the second switching circuit 120B is adapted to be driven by the signal $S_2'$ phase-shifted through the phase shifter circuit 200. Accordingly, in the case where a constant current $I_{130}$ from a constant-current supply source is allowed to flow through diodes (or resistors) 161 and 162 provided at the output of the second switching circuit 120B only for a period during which an input signal is present at the input of the second switching circuit 120B, and diodes (or resistors) 161 and 162 provided at the output stage of the second switching circuit 120B, a current signal having a pulse width corresponding to the phase difference between the signals $S_2$ and $S_2'$ will flow through the diodes 161 and 162 and give rise to variation in the voltage across the diodes 161 and 162. The averaged value of such voltage variation is derived through a low-pass filter 400. In this manner, D.C. voltage variation corresponding to the phase difference described above can be obtained and thus an FM modulated input signal will be demodulated. Since the demodulating operation of the demodulation circuit 5 is based on the same principle as that of the demodulation circuit described hereinafter, detailed description of the demodulating operation is omitted at this point.

In connection with the demodulation circuit unit of the type described above, it is frequently demanded by the users that the magnitude of the demodulated output from the demodulation circuit could be conveniently or optionally changed in dependence upon the variety of amplifiers or the like circuits connected as a succeeding stage of the demodulation circuit. However, it is difficult to satisfy such demand in practice in the case of the demodulation circuits for the following reasons.

Namely, in the case of the demodulation circuit shown in FIG. 1, two means are conceivable for varying the magnitude of the demodulated output. The first means will be the externally accessible resonance resistor 213 of the resonance circuit 210 which can be so adjusted as to influence the distortion as well as the magnitude of the demodulated output. Another means may be provided by an output resistor 300' which is also provided as an externally accessible element at the time of manufacturing the major portion 100 of the demodulation circuit 5 in an integrated circuit so that the resistance value of the discrete output resistor 300' may be externally varied.

The first means is however disadvantageous in that distortion of the demodulated output will undergo changes as the output is varied. More particularly, when the resistance value $R_{213}$ of the resonance resistor 213 is increased, then the frequency-versus-phase characteristic (FIG. 4) of the resonance circuit 210 will be changed with the inclination or slope of the characteristic curve being increased or steepened, which brings about an increase in the distortion along with the increased magnitude of the demodulated output. On the other hand, decreased resistance value $R_{213}$ of the resonance resistor 213 will result in a small slope of the above characteristic curve, involving decrease in the magnitude and distortion of the demodulated output. Such phenomenon is generally known in the art. Further, the switching function of the second switching circuit 120B constituting the gate circuit 120 will tend to become imperfect. This is because the resonance resistor 213 operates also as the bias resistor for the second switching circuit 120B and decreased resistance value of the resistor 213 is inevitably accompanied with a decreased bias voltage applied to the second switching circuit 120B.

The second means described above is impractical in that the output resistor 300' can not be implemented as a discrete externally accessible element, because in such cases the demodulated output appearing at the output terminal will become non-uniform for the following reasons.

In general, in the case of the integrated circuits, deviation of resistance values of resistors can be retained in the range of ±5%. However, the deviation of resistance in the absolute value would amount to ±30%. By way of example, assuming that the individual resistors of the integrated circuit 100 are deviated from the desired or normal values for +30% and the resistance values become 1.3 times as great as the latter, the constant current $I_{130}$ flowing in the constant-current source circuit 130 will be decreased to 1/1.3 as accompanied with correspondingly decreased current flow in various circuitries. The current flowing through the output resistor 300' will be of course decreased. Assuming again that the output resistor 300' has resistance value deviated for +30% as is in the case of the individual resistors of the integrated circuit 100 and has 1.3 times as great as the desired value, the voltage drop appearing across the output resistor 300', that is, the output signal of the demodulation circuit may remain uniform, so long as the resistor 300' is incorporated in the integrated circuit. However, if the output resistor 300' is provided as an external discrete element with a view to allowing the adjustment of the demodulated output, there will appear non-uniform or fluctuating signals at the output terminal of the demodulation circuit because the deviation of the resistance value of the discrete output resistor 300' will differ from those of the integrated resistors in addition to the fact that there is no correlation between the magnitude of the constant current $I_{130}$ determined by the internal resistances of the integrated circuit and the deviation of the resistance value of the external output resistor 300'. For these reasons, the output resistor 300' could not be provided as the external discrete element in this demodulation circuit.

SUMMARY OF THE INVENTION

Accordingly, an object of the invention is to provide a phase-shifting multiplication type FM demodulation circuit of which the output resistor for determining the magnitude of the demodulated output can be composed of an externally provided discrete resistor without incurring unacceptable non-uniformity or fluctuations in the demodulated output.

Another object of the invention is to provide a phase-shifting multiplication type FM demodulation circuit in which the magnitude of the demodulated output therefrom can be optionally varied.

Still another object of the invention is to provide a phase-shifting multiplication type FM demodulation circuit which is suited to be implemented in an integrated circuit configuration.

A further object of the invention is to provide a phase-shifting multiplication type FM demodulation circuit in which demodulation of an amplitude-modulated signal (hereinafter referred to as AM signal) can be reduced.

With the above objects in view, the invention proposes that the resonance resistor which exerts influence on the demodulated output is formed in an integrated circuit together with the switching circuits, etc., while the output resistor is provided as an externally accessible discrete element.

According to an aspect of the invention, the deviation of the constant current of the constant-current source circuit and hence the deviation of the demodulated output as caused by deviation of resistance values of internal resistors implemented in the integrated circuit are compensated by the resonance resistor to suppress fluctuations or non-uniformity in the demodulated output signal.

Since fluctuation or non-uniformity of the demodulated output can be suppressed according to the teaching of the invention, the output resistor can be provided as an externally accessible discrete element. By virtue of this feature, the magnitude of the demodulated output signal of the demodulation circuit can be optionally varied by correspondingly selecting the resistance value of the output resistor.

DESCRIPTION OF THE PREFERRED EMBODIMENTS

Figure 1:
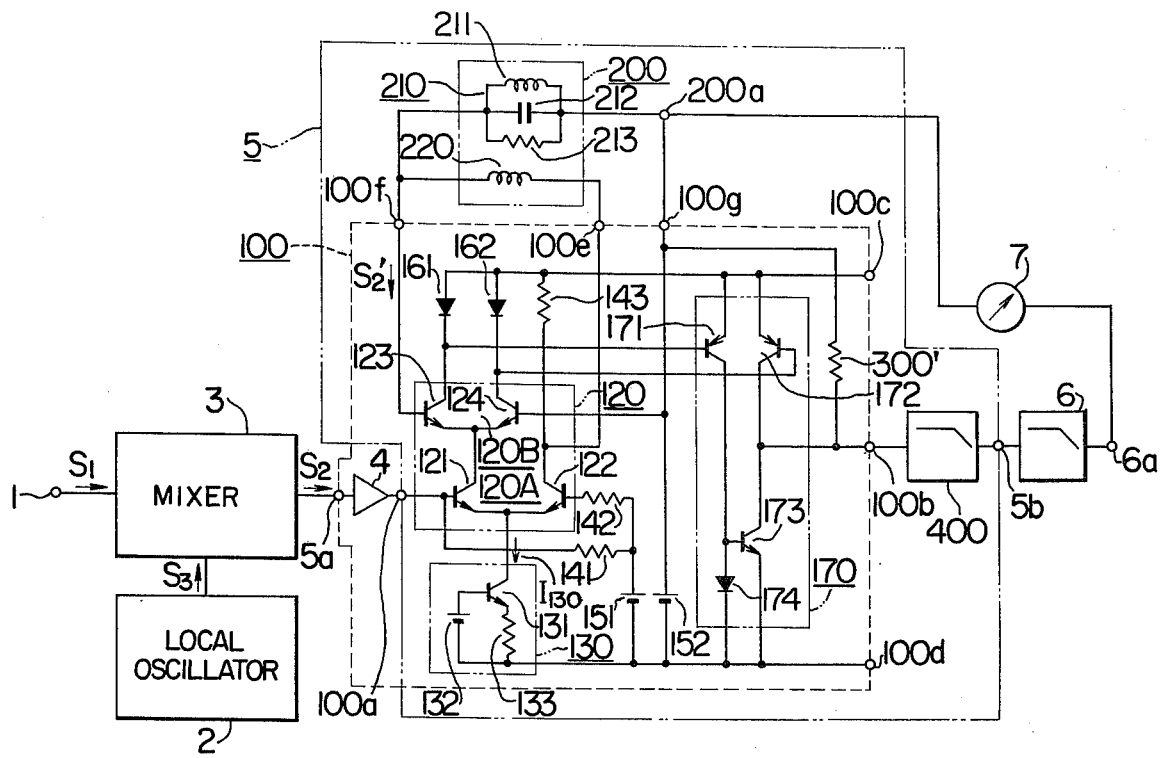
FIG. 1 is a circuit diagram showing a phase-shifting multiplication type FM demodulation circuit.
Figure 2:
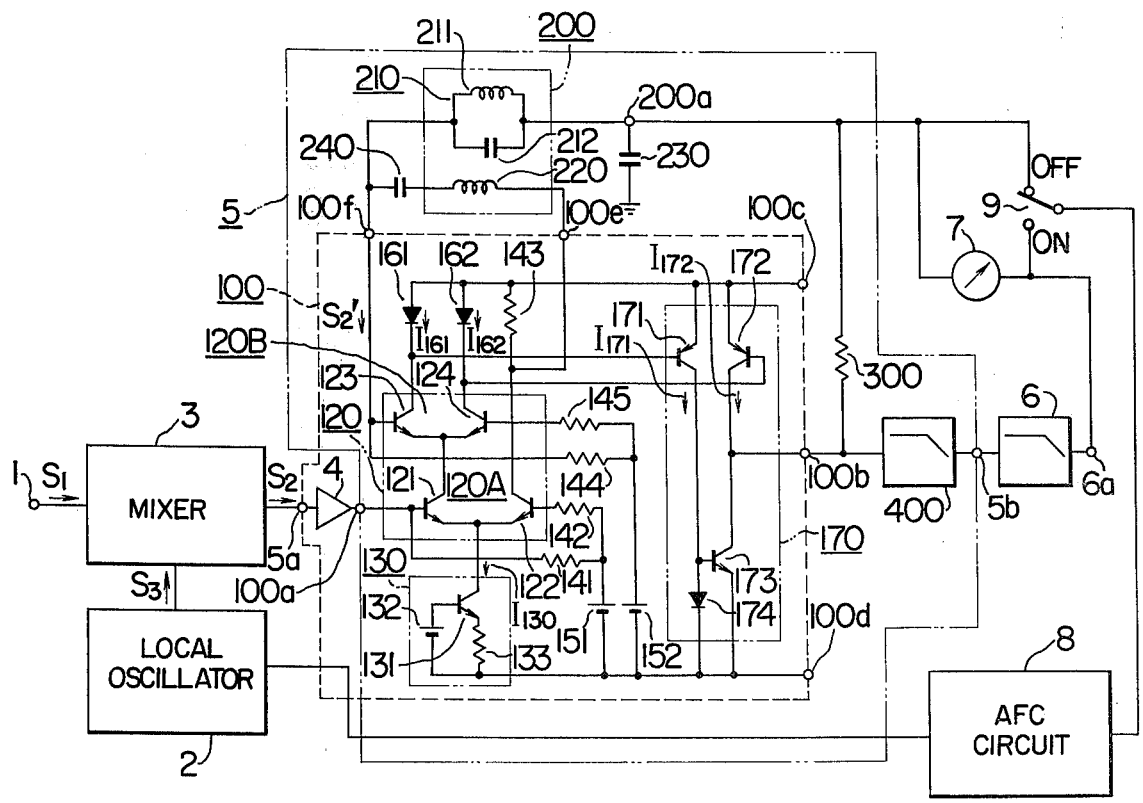
FIG. 2 is a circuit diagram showing a phase-shifting multiplication type FM demodulation circuit in accordance with an embodiment of the invention.

Now, the invention will be described more in detail with reference to the drawings showing exemplary embodiments of the invention. FIG. 2 is a circuit diagram showing a first embodiment of the invention. In the figure, same parts or elements as those of the circuit shown in FIG. 1 are denoted by like reference symbols.

Referring to FIG. 2, reference numeral 120 denotes a gate circuit adapted to be switched for the output signal $S_2$ from the amplifier 4. The gate circuit 120 comprises a first switching circuit 120A composed of paired differential transistors 121 and 122, and a second switching circuit 120B composed of paired differential transistors 123 and 124. The common emitter of the paired transistors 121 and 122 is connected to a grounded terminal 100d through a constant-current source circuit 130. The base of the transistor 121 is connected to the amplifier 4 through an input terminal 100a and at the same time to the grounded terminal 100d through a resistor 141 and a bias voltage source 151. The collector of the transistor 121 is connected to the common emitter of the paired transistors 123 and 124. The base of the transistor 122 is connected to the grounded terminal 100d through a resistor 142 and a bias voltage source 151 while the collector thereof is directly connected to a supply source terminal 100e and to a source terminal 100c through a resistor 143. The base of the transistor 123 is connected to the grounded terminal 100d through a resistor 144 and a bias voltage source 152 and at the same time to a terminal 100f. The base of the transistor 124 is connected to the grounded terminal 100d through a resistor 145 and the bias voltage source 152. The constant-current source 130 includes a transistor 131, a supply source 132 and a resistor 133. The constant current $I_{130}$ is determined by the supply source 132 and the resistor 133. Resistors 141, 142, 143, 144 and 145 constitute the bias resistors for the switching circuits 120A and 120B. The resistor 144 serves also as the resonance resistor of a resonance circuit 210 and the resistance value thereof is selected at the minimum value allowable in the range in which the stable operation of the switching circuit 120B can be assured. Numerals 161 and 162 denote diodes of which cathodes are connected to the collectors of the transistors 123 and 124, respectively. The anodes of these diodes are connected in common to the current source terminal 100c. Numeral 170 designates a differential amplifier circuit for detecting difference between the gate output signals appearing across the diodes 161 and 162. The differential amplifier circuit comprises a pair of transistors 171 and 172, a current source transistor 173 and a diode 174. The base of the transistor 171 is connected to the collector of the transistor 123 constituting a part of the switching circuit 120B, while the emitter of the transistor 171 is connected to the current source terminal 100c. The transistor 171 has a collector connected to the base of the transistor 173. On the other hand, the base of the transistor 172 is connected to the collector of the transistor 124 constituting the switching circuit 120B, while the emitter of the former is connected to the current source terminal 100c with the collector being connected to the collector of the transistor 173. The base of the transistor 173 is connected to the grounded terminal 100d through a diode 174, while the emitter thereof is directly connected to the terminal 100d. Numeral 200 denotes the phase-shifter circuit which comprises a phase-shifting coil 220 for shifting the phase of the FM intermediate frequency signal derived at the terminal 100e and a resonance circuit 210 for phase-shifting the phase-shifted frequency signal from the shifting coil 220 and feeding to a terminal 100f. The resonance circuit 210 is composed of a coil 211 and a capacitor 212 connected in parallel and has one end connected to the terminal 100f with the other end being grounded through a terminal 200a and a capacitor 230. In this connection, it will be appreciated that a ceramic filter or the like may be employed for the resonance or tuning circuit 210. With such arrangement that one end of the tuning circuit 210 is grounded, the terminal 200a which is supplied with voltage from the bias voltage source 152 through the resistor 144, terminal 100f and the resonance circuit 210 can be used as a reference voltage terminal. Thus, the terminal only for the integrated circuit 100 can be spared. The phase-shifting coil 220 has one end connected to the terminal 100f through a capacitor 240 and the other end connected to the terminal 100e. Reference numeral 300 denotes the output resistor connected between the terminals 100b and 200a. The output resistor 300 is composed of an external resistance element provided discretely from the integrated circuit 100. Provided in a succeeding stage of the output resistor 300 is a low pass filter 400 which serves to eliminate harmonic components of the output signal appearing across the output resistor 300 and supply the demodulated signal (sound signal) to the terminal 5b. Numeral 6 denotes another low-pass filter provided in a succeeding stage of the filter 400 and having a greater time constant than that of the latter. The filter 6 serves to take out the D.C. variation signal appearing at the terminal 5b and hence at the terminal 100b. A tuning indicator 7 is connected between the filter 6 and the terminal 200a. The tuning indicator 7 serves to detect a voltage difference between the terminals 100b and 200a and has a pointer adapted to swing in dependence on the magnitude of the detected level. Thus, the tuning indicator 7 can be utilized for setting distortion of the demodulated output signal. Numeral 8 denotes an automatic frequency control circuit (hereinafter simply referred to as AFC), and 9 designates an ON-OFF change-over switch for AFC. The stationary terminal OFF of the switch 9 is connected to the terminal 200a, while the other stationary contact ON is connected to the output terminal of the low-pass filter 6. The switch 9 has a movable contact connected to a local oscillator 2 through the AFC circuit 8.

Next, the demodulating operation of the FM demodulation circuit will be described.

When no input signal is present in the circuit shown in FIG. 2, the individual transistors of the first and the second switching circuits are in the conductive state or turned "on". The D.C. currents of the same amplitude ($\frac{1}{2} I_{130}$) will flow through the transistors 121 and 122, respectively. In a similar manner, D.C. currents of the same amplitude ($\frac{1}{4} I_{130}$) will flow through the transistors 123 and 124, and the diodes 161 and 162. The same D.C. currents as the ones flowing through the diodes 161 and 162 will flow through the transistors 171 and 172 of the differential amplifier circuit 170. In other words, arrangement is made such that no flow of D.C. signal to the output resistor 300 from the output terminal of the differential amplifier circuit or vice-versa may occur. Accordingly, the output terminal 100b is at the same potential as the voltage reference terminal 200a and no D.C. current will flow through the output resistor 300 connected between these terminals. The pointer of the tuning indicator 7 will not swing.

Figure 3:
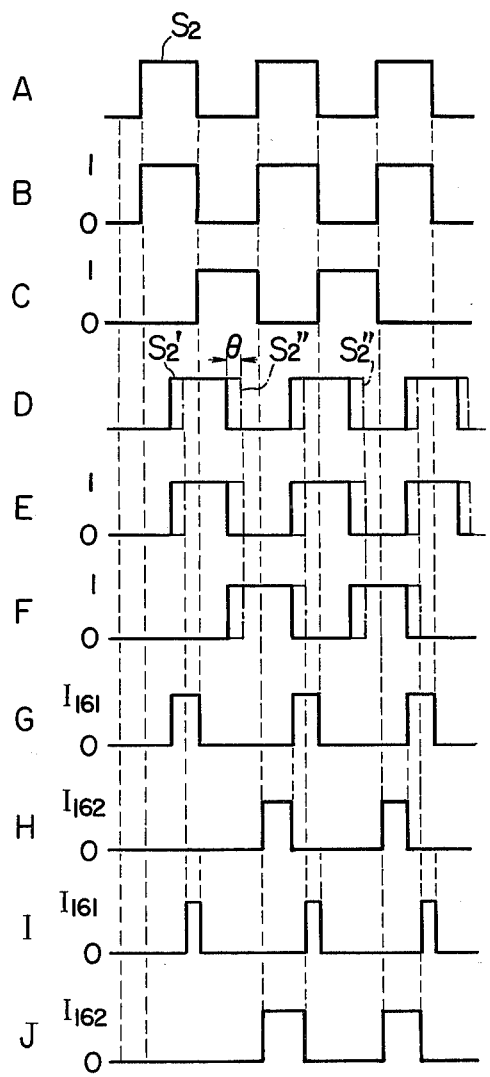
FIG. 3 is a signal waveform diagram to illustrate the invention.

When a non-modulated FM intermediate frequency signal is supplied to the input terminal 100a, the input signal is derived at the output terminal of the amplifier 4 as the output signal $S_2$ of a rectangular waveform as shown in FIG. 3A after having been amplified and undergone the amplitude-limiting operation by the amplifier 4. This signal $S_2$ is supplied to the base of the transistor 121 constituting a part of the first switching circuit 120A. The transistor 121 will then be turned on and off for every $\frac{1}{2}$ period of the signal $S_2$. In a similar manner, the transistor 122 will also perform the ON-OFF switching operation for every $\frac{1}{2}$ period of the signal $S_2$ in response to the operation of the transistor 121. More particularly, the transistors 121 and 122 are alternatively turned or switched on and off for every half period of the signal $S_2$. Such switching operations of both transistors are illustrated in the signal waveform diagram of FIG. 3. Refer to the waveforms B and C. The signal $S_2$ is supplied also to the input terminal 100e of the phase-shifter device 200 through the transistor 122 of the first switching circuit 120A. The phase-shifter device 200 is so designed that, when the signal $S_2$ resonates at the resonance frequency $f_o$ of the resonance circuit 210, the phase of the output signal from the device 200 becomes out of phase from the signal $S_2$ by about $\pi/2$ (90°). In the following description, it is assumed that the phase shifting through the device 200 amounts to $\pi/2$ (90°), for the convenience' sake of description. When the frequency of the signal $S_2$ is deviated from the resonance frequency $f_o$ of the resonance circuit 210, the phase shifting is effected in accordance with the frequency-versus-phase characteristic curve 210a of the resonance circuit 210 shown in FIG. 4b.

As will be appreciated from the foregoing description, when the signal $S_2$ is at the resonance frequency $f_o$ of the circuit 210, the signal $S_2$ supplied to the phase-shifter device 200 will be phase-shifted for $\pi/2$ (90°) or delayed for $\pi/2$ (90°) as is represented by solid line waveform D in FIG. 3 and make appearance at the output terminal 100f of the phase-shifter 200. The delayed signal $S_2'$ is supplied to the base of the transistor 123 of the second switching circuit 120B from the terminal 100f. Then, the transistor 123 is turned on and off for every $\frac{1}{2}$ period of the signal $S_2'$ with the counter-part transistor 124 being responsively turned off and on in a similar manner. In other words, the transistors 123 and 124 are alternatively turned on and off for every half period of the signal $S_2'$. Such switching operations of the transistors 123 and 124 are illustrated in FIG. 3 by waveforms E and F, respectively.

In the switching operation described above, when the transistor 121 of the first switching circuit 120A is turned on at the same time with the turn-on of the transistor 123 of the second switching circuit 120B, the current $I_{161}$ of the waveform G shown in FIG. 3 will flow through the diode 161 for the duration corresponding to ¼ period of the signal $S_2$, which current $I_{161}$ can be mathematically expressed as follows:

$$I_{161} = \frac{1}{2} \int_0^{\frac{\pi}{2}} I_{130} d\theta = \frac{I_{130}}{2\pi} \cdot \frac{\pi}{2} = \frac{I_{130}}{4} \quad (1)$$

On the other hand, when the transistors 121 and 124 of the first and the second switching circuits 120A and 120B are turned on, current $I_{162}$ of the waveform H shown in FIG. 3 will flow through the diode 162 for the duration corresponding to one-fourth or ¼ period of the signal $S_2$. The current $I_{162}$ can be given as follows:

$$I_{162} = \frac{1}{2\pi} \int_0^{\frac{\pi}{2}} I_{130} d\theta = \frac{I_{130}}{2\pi} \cdot \frac{\pi}{2} = \frac{I_{130}}{4} \quad (2)$$

These currents $I_{161}$ and $I_{162}$ will then flow to the differential amplifier circuit 170. However, since these currents coincide with the ones flowing through the diodes 161 and 162 at the time when no input signal is present, as described hereinbefore, no current flow will occur at the output terminal of the subtraction circuit. The tuning indicator 7 will also remain as it is.

Next, it is assumed that a modulated FM intermediate frequency signal is supplied to the input terminal 100a and the frequency of the input signal is deviated for $\Delta f$ from the resonance frequency $f_o$ of the resonance circuit 210 with the phase being shifted by $\theta$ as represented by the broken line waveform D in FIG. 3. Under these conditions, the switching operations of the transistors 121 and 122 of the first switching circuit 120A will be deviated in phase by the amount $\theta$ as represented by the waveforms E and F in FIG. 3. Accordingly, the time durations during which currents flow through the diodes 161 and 162 are such as shown by waveforms I and J in FIG. 3. The currents flowing through the diodes 161 and 162 at the time can be given by the following expressions:

$$I_{161} = \frac{1}{2\pi} \int_0^{\frac{\pi}{2} - \theta} I_{130} d\theta = \frac{I_{130}}{2\pi} (\frac{\pi}{2} - \theta) \quad (3)$$

$$= I_{130}(\frac{1}{4} - \frac{\theta}{2\pi})$$

$$I_{162} = \frac{1}{2} \int_0^{\frac{\pi}{2} + \theta} I_{130} d\theta = \frac{I_{130}}{2\pi} (\frac{\pi}{2} + \theta) \quad (4)$$

$$= I_{130}(\frac{1}{4} + \frac{\theta}{2\pi})$$

It will thus be appreciated that the current flowing through the diode 161 is decreased for an amount $$I_{130}\frac{\theta}{2\pi}$$

due to the phase deviation $\theta$, while the current in the diode 162 is increased for the same amount.

In other words, averaged currents flowing through the diodes 161 and 162 will vary in proportion to the phase deviation $\theta$ or the frequency deviation $\Delta f$ from the resonance frequency $f_o$ of the resonance circuit, as can be seen from the expressions (3) and (4). Such current variations $$I_{130}\frac{\theta}{2\pi}$$

are fed to the subtraction circuit and processed in the following manner:

$$I_{130}(\frac{1}{4} + \frac{\theta}{2\pi}) - I_{130}(\frac{1}{4} - \frac{\theta}{2\pi}) = I_{130}\frac{\theta}{\pi}$$

The signal resulting from the subtraction is supplied to the output resistor 300.

Then, current $$I_{130} = I_{130}\frac{\theta}{\pi} \quad (5)$$

will flow through the resistor 300. Thus, the output signal $e$ can be obtained, which is given by $$e = I_{130}\frac{\theta}{\pi} \cdot R_{300} \quad (6)$$

$$\theta = K\Delta f, \text{ when } K \text{ is a proportional constant} \quad (7)$$
$$\text{for } \Delta f\text{-to-}\Delta\theta \text{ conversion}$$

$$e = I_{130} \cdot \frac{K}{\pi} \cdot R_{300} \cdot \Delta f \quad (8)$$

When the output signal $e$ is supplied to the low-pass filter 400 to thereby eliminate harmonic components, then a demodulated signal is available at the output terminal 5.

As will be understood from the equation (8), the magnitude of the demodulated signal is determined by the constant current $I_{130}$ of the constant-current source circuit 130, the resistance value $R_{300}$ of the output resistor 300 and the slope of the frequency-versus-phase characteristic curve of the resonance circuit 210. Accordingly, the magnitude of the demodulated output signal may be varied by making one of the above three parameters variable. However, since the constant-current source circuit 130 as well as the resonance resistor 213 having an influence to the frequency-versus-phase characteristic of the resonance circuit are intended to be implemented in the integrated circuit, it is impossible to adjust the magnitude of the demodulated output signal by utilizing these two parameters. Such being the case resort is made to the output resistor 300 in order to regulate the magnitude of the output signal $e$.

In the circuit configuration according to the invention as described above, it is possible to regulate or vary optionally the demodulated output signal by means of the output resistor 300.

Figure 4A:
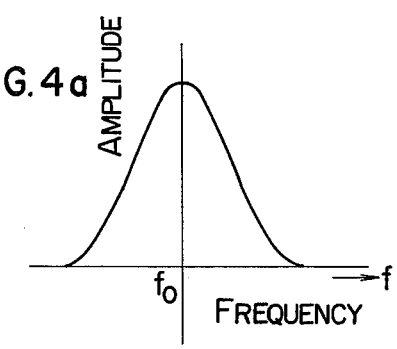
FIGS. 4a and 4b illustrate a frequency-versus-amplitude and a frequency-versus-phase characteristic of a resonance circuit for a better understanding of the invention, respectively.
Figure 4B:
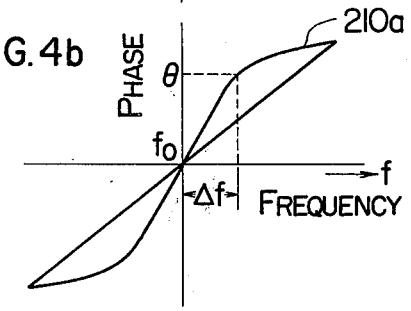

It is assumed again that the internal resistances of the integrated circuitry 100 are deviated for +30% from the desired values and are 1.3 times as great as the latter, as is in the case of the circuit described hereinbefore in conjunction with FIG. 1. Then, the constant current $I_{130}$ of the constant-current source circuit will be decreased to $1/1.3\ I_{130}$, resulting in a correspondingly decreased current flow in the output resistor 300. The demodulated output signal e will of course tend to decrease. However, since the bias resistor 144 which serves also as the resonance resistor of the resonance circuit 210 has the resistance value deviated for +30% from the normal value, the slope of the frequency-versus-phase characteristic curve 210a of the resonance circuit 210 shown in FIG. 4 is correspondingly steepened and effective to increase the demodulated output. Thus, the tendency of the demodulated output signal to decrease is suppressed.

As is well known in the art, the slope of the frequency-versus-phase characteristic curve is proportional to the resonance resistance in the vicinity of the resonance frequency of the resonance circuit. Further, when the resistor 144 is connected in parallel to the resonance circuit 210 as shown in FIG. 2 and the resistance value of the resistor 144 is selected sufficiently small as compared with the resistance value of the tuning or resonance circuit itself, then the slope of the characteristic curve will be proportional to the resistance value of the resistor 144. In this connection, it is to be noted that the resistor 144 is selected at a small value according to the invention as described hereinbefore, and the slope of the frequency-versus-phase characteristic curve is proportional to the value of the resistor 144.

In this manner, in the circuit configuration according to the invention shown in FIG. 2, the possible deviation of the demodulated output signal due to the deviations of the internal resistances of the integrated circuit 100 in respect of the absolute values is corrected by the resistor 144 which is provided in the integrated circuitry 100 and serves also for the resonance resistor of the resonance circuit 210. Thus, it is possible to obtain a uniform demodulator output signal according to the invention.

For the above described reason, the output resistor 300 can be discretely provided independently from the integrated circuit portion, which in turn allows the optional regulation of the demodulated output signal by appropriately selecting the value of the output resistor 300.

Additionally, the small value of the resistance 144 will contribute to reduce the distortion of the demodulated output signal, since the slope of the frequency-versus-phase characteristic curve of the resonance circuit is also made small.

In the above described embodiment, the reference voltage in the integrated circuitry 100, i.e. the voltage of the bias source 151 is supplied through the terminal 100f of the integrated circuitry 100 and the resonance circuit 210. By virtue of such arrangement, the number of terminals for the integrated circuit can be decreased by one. Thus, the circuit configuration according to the invention is advantageously suited for the implementation in a form of the integrated circuit.

It has been observed that, when the demodulation circuit described above is applied to a radio receiver, AM signals (500 KHz to 2.6 MHz) will sometimes be inputted to the input terminal 5a of the amplifier 4 in addition to the FM intermediate frequency signal (10.7 MHz). Such phenomenon becomes more remarkable when an FM signal is to be received in the area near to a broadcasting station sending out AM signal.

In this connection, it is noted that, if an incoming AM signal is of a relatively high amplitude, the AM component, will be effectively suppressed due to the amplitude limiting operation of the amplifier 4. On the other hand, when an AM signal has such a small amplitude as is immune to the amplitude limiting operation of the amplifier 4, then the latter will operate as a linear amplifier, whereby the AM signal will be inputted to the first switching circuit 120A. Since the first switching circuit 120A functions as a differential amplifier for a small amplitude signal, the AM signal will be amplified by the switching circuit 120A. The amplified AM signal will then flow to the diodes 161 and 162 by way of the differential transistors 123 and 124 of the second switching circuit 120B and also to the resistor 143.

Now, description will be made to the case where the AM signal appearing across the resistor 143 is grounded through the phase-shifter device 200 as is in the case of the demodulation circuit shown in FIG. 1.

When the transistor 123 and the diode 161 are balanced with the transistor 124 and the diode 162, the AM signals of the same amplitude and phase will flow through the transistors 123 and 124 and then are reduced to zero through the operation of the succeeding subtraction circuit, resulting in the non-appearance of any demodulated AM signal at the output terminal 100b. Thus, the AM signal appearing across the resistor 143 can be by-passed to ground, as described above.

However, in practice, it is improbable that the transistor 123 and diode 161 are functionally balanced with the transistor 124 and the diode 162. It is rather usual that unbalanced states prevail among these elements.

Under such conditions, AM signals of different amplitudes will flow through the transistors 123 and 124. Subtraction of these AM signal at the subtraction circuit will produce a difference signal representative of the amplitude difference between the AM signals, as a result of which the AM signal will be domodulated and appear at the output terminal 100b.

On the other hand, it will be noted that in the circuit arrangement according to the invention shown in FIG. 2, the AM signal appearing across the resistor 143 is inhibited from flowing to the ground through the impedance of a capacitor 230 which connects one end of the resonance circuit 210 to the ground. The capacitance value of the capacitor 230 is so selected that the impedance thereof is sufficiently small as compared with the resonance resistance value of the resonance circuit 210 for the FM signal (carrier), while the capacitor 230 may provide an impedance of an appropriately large value for preventing the AM signal from flowing toward the ground. For example, a capacitor having a capacitance value in the range of 100 to 900 pF may be employed. By way of example, it is assumed that the capacitor of 100 pF is used. Then, the impedance 8 provided by the capacitor 230 is given as follows:

$$Z = \frac{1}{\omega C} = \frac{1}{2\pi f C}$$

when $f = 1$ MHz and $C = 100$ pF, then $$Z = \frac{1}{2\pi \times 10^6 \times 100 \times 10^{-12}} \approx \frac{10^4}{6} \approx 1.7\ k\Omega$$

Under these conditions, the AM signal appearing across the resistor 143 is inhibited from flowing to the ground by the capacitor 230 and applied to the base of the transistor 123 of the second switching circuit 120B.

Such an input signal is effective to increase the base voltage of the differential transistor 123 thereby to increase, for example, the collector current of the transistor 121 of the first switching circuit 120A. When the collector currents of the differential transistors 123 and 124 tend to increase in proportion to the collector current of the transistor 121, the increased current will flow to the transistor 123 since the forward base bias therefor is selected greater than that of the transistor 124. In this way, the AM signal is processed as a negative feedback signal of the differential transistor 124.

Accordingly, when the initial operating points of the paired transistors 123 and 124 are previously deviated slightly from each other, e.g. when the amplitude of the collector output of the transistor 123 is set smaller than that of the transistor 124, the amplitudes of AM signals flowing through the collectors of the paired differential transistors 123 and 124 tends to become equal to each other. Then, the subtraction circuit will operate to cancel these AM signals to each other, whereby the demodulation of AM signal at the output terminal 100b can be significantly suppressed.

The circuit arrangement for reducing the AM signal demodulation described above can be equally applied to the phase-shifting multiplication type FM demodulation circuit which is so arranged that FM demodulated signal may be derived only from the one transistor 124 of the second switching circuit 120B.

Figure 5:
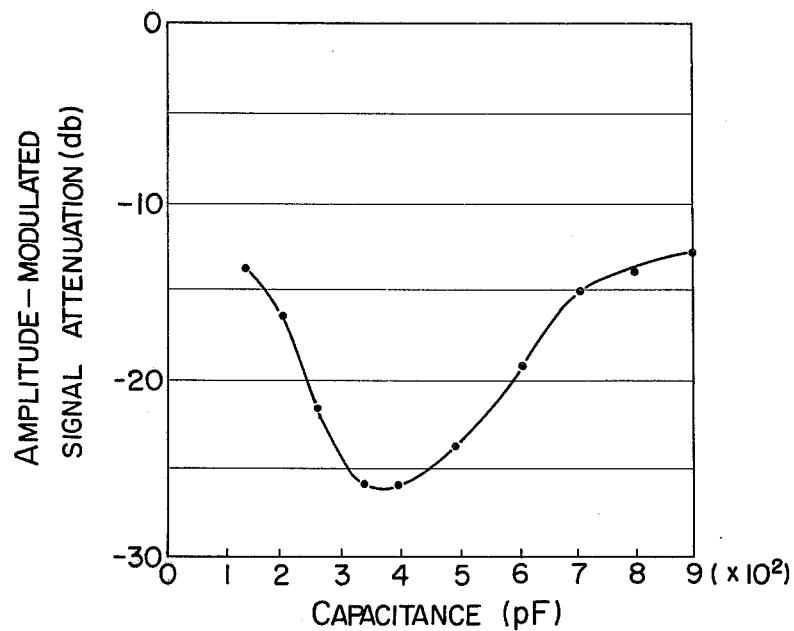
FIG. 5 illustrates the characteristic relationship between a capacitance of a capacitor 230 and an amplitude-modulated signal attenuation for facilitating the understanding of the teaching of the invention.

FIG. 5 shows graphically attenuation of the AM demodulated output in dependence upon the capacitive values of the capacitor 230 in the range of 100 to 900 pF. The conditions for measurement of the characteristics shown in FIG. 5 are selected as follows:

| AM signal (carrier): | 1 MHz |
|---|---|
| Input level of AM signal (carrier): | 20 μV |
| Modulation frequency: | 400 Hz |
| Modulation degree: | 30% |

In FIG. 5, 0 (db) along the ordinate represents the FM demodulation output at the FM modulation degree of 100%.

It will be understood from the characteristic graph of FIG. 5 that there is a proper value for the capacitance of the capacitor 230. The best results could be obtained when the capacitance of the capacitor is selected at a value in the range of 300 to 400 pF. However, since AM signal has a frequency range of 500 KHz to 2.6 MHz, it will be unsafe to say that the capacitance value should be selected definitely in the above range. The selection should be preferably made in consideration of the receiving conditions of AM signals.

In the demodulation circuit described above, when D.C. voltage variation ocurring at the output terminal 100b when output signal flows through the output resistor 300 is taken out through the low-pass filters 400 and 6 and applied to one end of the tuning indicator 7 which has its other end applied with the reference voltage from the reference voltage terminal 200a, the indicator 7 will give an indication in dependence on the difference between the D.C. voltage variation and the reference voltage. Such indication, therefore, represents that the input FM intermediate signal is not tuned with the resonance circuit 210.

When the oscillation signal of the local oscillator 2 shown in FIG. 2 drifts under the influence of some environmental conditions and as a consequence the input signal to the FM intermediate frequency signal input terminal 5a is deviated from the resonance frequency $f_o$ of the resonance circuit 210, incurring an increased distortion in the demodulation output, then the D.C. signal derived through the low-pass filter 6 is applied to the local oscillator 2 through the switch 9 and AFC circuit 8 thereby to control the oscillation frequency of the oscillator 2. Distortion of the demodulated output signal can be thus corrected. Usually, the switch 9 is changed over to the contact OFF and the local oscillator 2 is supplied with reference voltage from the terminal 200a in the stabilized state.

Figure 6:
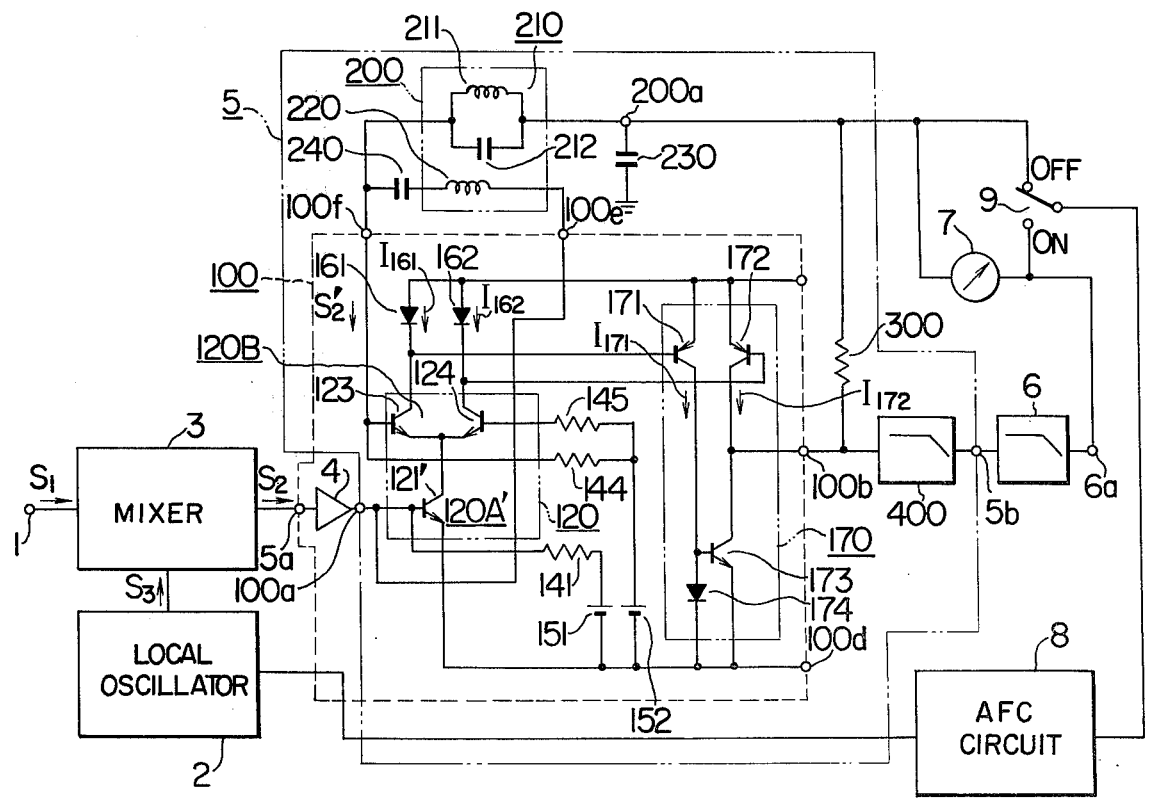
FIG. 6 is a circuit diagram showing another embodiment of the phase-shifting multiplication type FM demodulator circuit according to the invention.

FIG. 6 shows a modification of the demodulation circuit shown in FIG. 2. In FIG. 6, the input terminal 100a of the integrated circuitry 100 is on one hand connected to the base of the switching transistor 121 of the switching circuit 120A' of the gate circuit 120 and on the other hand connected to the base of the switching transistor 123 of the switching circuit 120B through the terminal 100e, phase-shifter device 200, capacitor 240 and the terminal 100f. In other words, in the case of the circuit arrangement shown in FIG. 6, the switching circuit 120A and the constant-current source circuit 130 of FIG. 2 is replaced by the single switching transistor 121', the collector current of which is adapted to be switched in response to the FM intermediate frequency signal of the rectangular waveform supplied to the switching circuit 120B through the phase-shifter device 200. With respect to the other circuit elements and the demodulating operation, the circuit shown in FIG. 6 is the same as that of FIG. 2. The same circuit portions and elements are denoted by the same reference symbols as indicated in FIG. 2. The embodiment shown in FIG. 6 exhibit similar advantages as those of the demodulation circuit shown in FIG. 2.

We claim:

1. A phase-shifting multiplication type FM signal demodulator circuit, comprising an input terminal for an FM signal, a demodulation output terminal, a gate circuit in the form of an integrated circuit including a first and second switching circuits for switching said FM signal, said gate circuit being opened to produce an output only during the time duration in which both of said first and second switching circuits are simultaneously in the conductive state, a circuit for feeding said FM signal from said input terminal to said first switching circuit of said gate circuit, a phase-shifter device for phase-shifting said FM signal from said first switching circuit and, after frequency-to-phase conversion of the phase-shifted FM signal, feeding the resulting signal to said second switching circuit, said phase-shifter device including an element for shifting the phase of said FM signal and a resonance circuit adapted to be resonated with the FM signal phase-shifted by said phase-shifting element and to perform phase-conversion of the resonance frequency of said FM signal, a voltage source for generating a reference voltage, a resistor serving as a resonance resistor of said resonance circuit, a detector circuit for detecting the gated output signal appearing at the output stage of said gate circuit and applying its output to said demodulation output terminal, and an output resistor for determining magnitude of the signal at said demodulation output terminal, said resonance resistor being connected between said reference voltage generating source and a junction point of said second switching circuit and said resonance circuit and implemented in the integrated circuit of said gate circuit, while said output resistor is provided as an external element independently from said integrated circuit.

2. A phase-shifting multiplication type FM signal demodulation circuit as set forth in claim 1, wherein said resonance resistor serves also as a bias resistor of the second switching circuit of said gate circuit.

3. A phase-shifting multiplication type FM signal demodulation circuit as set forth in claim 1, wherein said resonance resistor is set to a smaller resistance value than the inherent resonance resistance of said resonance circuit itself.

4. A phase-shifting multiplication type FM signal demodulation circuit, comprising an input terminal for an FM signal, a gate circuit including a first and second switching circuits for switching said FM signal, said gate circuit being opened to produce an output only during the time duration in which both of said first and second switching circuits are simultaneously in the conductive state, a circuit for feeding said FM signal from said input terminal to said first switching circuit, a phase-shifter device for phase-shifting said FM signal from said first switching circuit and, after frequency-to-phase conversion of the phase-shifted FM signal, feeding the resulting signal to said second switching circuit, said phase-shifter device including an element for shifting the phase of said FM signal and a resonance circuit adapted to be resonated with the FM signal phase-shifted by said phase-shifting element and to perform phase-conversion of the resonance frequency of said FM signal, one end of said resonance circuit being connected to an input terminal of said second switching circuit, means for grounding the other end thereof, a voltage source for generating a reference DC voltage, a resistor connected between said voltage source and the junction point of said second switching circuit and said resonance circuit and serving as a bias resistor for said second switching circuit and a resonance resistor of said resonance circuit, means for blocking the application of said source voltage to said phase-shifting element, a gate signal detecting circuit for detecting a gate output signal appearing at the output stage of said gate circuit, an output resistor provided between said grounded end of said resonance circuit and said output stage of said gate signal detecting circuit and serving to determine the magnitude of the output signal from said gate signal detecting circuit, and a low-pass filter for eliminating higher harmonic components from the output signal derived from said gate signal detecting circuit thereby producing a demodulated signal, said resonance resistor being implemented in an integrated circuit together with said gate circuit and said gate signal detecting circuit, said output resistor being provided as an externally connectable element independent of said integrated circuit.

5. A phase-shifting multiplication type FM signal demodulation circuit as set forth in claim 4, wherein each of said first and second switching circuits is composed of paired differential transistors, one of said paired differential transistors constituting said first switching circuit being connected in series to the paired differential transistors of said second switching circuit thereby to form a multiplication circuit,
and wherein said gate signal detecting circuit comprises a subtraction circuit composed of paired differential transistors.

6. A demodulation circuit as set forth in claim 4, wherein said resistor serving as a bias and a resonance resistor is set at a smaller resistance value than the inherent resonance resistance of said resonance circuit itself.

7. A demodulation circuit as set forth in claim 4, wherein said means for blocking the application of said reference voltage is a capacitor.

8. A demodulation circuit as set forth in claim 4, wherein said means for grounding said resonance circuit is a capacitor which exhibits a sufficiently small impedance for the carrier frequency of said FM signal as compared with the resonance resistance value of said resonance circuit while exhibiting an appropriately large impedance for an AM signal.

9. A demodulation circuit as set forth in claim 4, further including a second low-pass filter provided at a stage succeeding said low-pass filter, said second filter having a greater time constant than said first-mentioned filter, and a tuning indicator connected between said second filter and the grounded end of said resonance circuit, said second filter being adapted to pass the D.C. variation voltage appearing at the output terminal of said second filter, said tuning indicator being driven by the difference voltage between the passed D.C. voltage and the bias voltage derived at the grounded end of said resonance circuit.

10. A demodulation circuit as set forth in claim 4, wherein said demodulation circuit further comprises a second low-pass filter provided at the stage succeeding said first-mentioned low pass filter and having a greater time constant than that of the latter, and an AFC device connected between said second filter and said grounded end of said resonance circuit, said AFC device being normally applied with a bias reference voltage appearing at said grounded end of said resonance circuit, and when said input signal to said demodulation circuit is varied under abnormal circumstances, a D.C. variation voltage appearing at the output terminal of said first-mentioned filter is extracted through said second filter to be utilized as an AFC signal.

11. A phase-shifting multiplication type FM signal demodulation circuit, comprising an input terminal for an FM signal, a first and second differential transistors adapted to be switched alternatively for every ½ period of said FM signal applied to said input terminal, a third and a fourth differential transistors adapted to be switched for every ½ period of said FM signal after having been phase-shifted thereby to turn on and off said first transistor, said third transistor having an operating point set slightly higher than that of said fourth transistor, said first, second, third and fourth transistors constituting a gate circuit which is opened to produce an output for a duration corresponding to ¼ of the period of said FM signal during which said first transistor and said third or fourth transistor are simultaneously turned on, a voltage source for biasing said third and fourth transistors, a circuit for feeding said FM signal from said input terminal to said first and second transistors of said gate circuit, a phase-shifter device for phase-shifting said FM signal passed through said second transistor by about $\pi/2(90°)$, performing a phase-conversion of the frequency of said phase-shifted FM signal and feeding the resulting FM signal to said third and fourth transistors to shift the switching operations of said third and fourth transistors by about $\pi/2(90°)$ relative to the switching operations of said first and second transistors, said phase-shifter device including a phase-shifting element for shifting the phase of said FM signal by about $\pi/2(90°)$ and a resonance circuit for performing the phase-conversion of the frequency of said FM signal after having been phase-shifted by said phase-shifting element, a first capacitor which is so selected in respect of capacitance value as to exhibit a sufficiently small impedance for the carrier of said FM signal as compared with the resonance resistance value of said resonance circuit while exhibiting an appropriately large impedance for an AM signal thereby to prevent said AM signal from flowing to the ground, means for connecting one end of said resonance circuit to an input electrode of said third transistor, means for grounding the other end through said first capacitor, a second capacitor for blocking application of the voltage on said first capacitor and the voltage from said voltage source to said phase-shifting element, a resistor connected between said voltage source and the input electrode of said third transistor and serving as a bias resistor and a resonance resistor of said resonance circuit, means for connecting an output electrode of said second transistor through said phase-shifting element and said second capacitor to thereby feed AM signal components flowing into an output electrode of said second transistor back to an input electrode of said third transistor, a detector circuit for detecting the gate output signal from said gate circuit, and an output resistor connected between the output terminal of said detector circuit and the end of said first capacitor connected to said resonance circuit for determining the magnitude of the output signal of said detector circuit.

12. In a phase-shifting multiplication type FM signal demodulator circuit comprising:
(1) an integrated circuit including
  a first differential switching circuit having two input terminals, two output terminals and a common terminal, one of said input terminals being supplied with FM intermediate frequency signal, the other input terminal being supplied with a reference voltage,
  a constant-current supply source connected with the common terminal of said first differential switching circuit,
  a second differential switching circuit having two input terminals, two output terminals and a common terminal which is connected with one of said output terminals of said first differential switching circuit, and
  a detector circuit connected with said second differential switching circuit for detecting the difference between the output signals appearing at the output terminals of said second differential switching circuit; and
(2) a phase-shifter device external to said integrated circuit and including
  a phase-shift element for supplying the FM output signal appearing at the other output terminal of said first differential switching circuit to one of the input terminals of said second differential switching circuit, the FM output signal thus supplied through said phase-shifting element being provided with a predetermined phase-shift, and
  a resonance circuit including a resonance inductor and a resonance capacitor connected in parallel with said resonance inductor to form two terminals thereof and coupled at one terminal thereof to the one input terminal of said second switching circuit and having a resonance frequency, said resonance circuit and said phase-shift element being so designed that the phase-shift element provides a 90° phase-shift to the FM output signal when the FM output signal resonates at the resonance frequency whereas the phase-shift element provides the FM output signal with a phase-shift different from 90° when the frequency of the FM output signal is deviated from the resonance frequency, the other one of the input terminals of said second switching circuit being supplied with a reference voltage;
and further comprising
  (a) a resonance resistor formed in said integrated circuit and connected at one end thereof to the one input terminal of said second switching circuit so as to be effectively connected in parallel with said resonance circuit;
  (b) a DC blocking capacitor external to said integrated circuit and connected in series with said phase-shift element between the one input terminal of said second switching circuit and the other one output terminal of said first switching circuit;
  (c) an AC bypass capacitor external to said integrated circuit and connecting the other one of the two terminals of said resonance circuit to ground therethrough; and
  (d) an output resistor external to said integrated circuit and connected at one end thereof to the other one of the two terminals of said resonance circuit and at the other end thereof to an output terminal of said detector circuit.

13. A phase-shifting multiplication type FM signal demodulation circuit as set forth in claim 12, wherein said resonance resistor serves also as a bias resistor of the second switching circuit of said gate circuit.

14. A phase-shifting multiplication type FM signal demodulation circuit as set forth in claim 12, wherein said resonance resistor is set to have a minimum resistance value within such a range that stable operation of the second switching circuit is assured.

15. A phase-shifting multiplication type FM signal demodulation circuit, comprising:
  a gate circuit including a first and a second switching circuit, said first switching circuit being supplied with an FM signal, said gate circuit being adapted to perform switching operations for said FM signal, said gate circuit being opened to produce an output only during the time duration in which both of said first and second switching circuits are simultaneously in the conductive state,
  a phase-shifter device for phase-shifting said FM signal appearing at an output terminal of said first switching circuit to thereby obtain a phase-shifted FM signal at an output terminal thereof and, after frequency-to-phase conversion of the phase-shifted FM signal, feeding the resulting signal to an input terminal of said second switching circuit, said phase-shifter device including an element for shifting the phase of said FM signal and a resonance circuit adapted to be resonated with the FM signal phase-shifted by said phase-shifting element and to perform phase-conversion of the resonance frequency of said FM signal;
  a resistor connected at one end thereof with the input terminal of said second switching circuit and serving as a resonance resistor of said resonance circuit;
  a detector circuit for detecting the gated output signal appearing at the output terminal of said gate circuit; and an output resistor for determining the magnitude of the output signal from said detector circuit, said resonance resistor being implemented in an integrated circuit together with said gate circuit while said output resistor is provided as an external element independent from said integrated circuit.

16. A phase-shifting multiplication type FM signal demodulation circuit as set forth in claim 15, wherein said resonance resistor serves also as a bias resistor of the second switching circuit of said gate circuit.

17. A phase-shifting multiplication type FM signal demodulation circuit as set forth in claim 15, wherein said resonance resistor is set to a smaller resistance value than the inherent resonance resistance of said resonance circuit itself.

* * * * *